United States Patent
Chiu et al.

(10) Patent No.: US 11,604,211 B1
(45) Date of Patent: Mar. 14, 2023

(54) TESTING DEVICE AND METHOD FOR INTEGRATED CIRCUIT PACKAGE

(71) Applicant: Taiwan Semiconductor Manufacturing Company, Ltd., Hsinchu (TW)

(72) Inventors: Shao-Chun Chiu, Hsinchu (TW); Wen-Feng Liao, Hsinchu (TW); Hao Chen, New Taipei (TW); Chun-Hsing Chen, Chu-Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/460,768

(22) Filed: Aug. 30, 2021

(51) Int. Cl.
*G01R 1/04* (2006.01)

(52) U.S. Cl.
CPC ........... *G01R 1/0466* (2013.01); *G01R 1/045* (2013.01)

(58) Field of Classification Search
CPC .............................. G01R 1/0466; G01R 1/045
See application file for complete search history.

(56) References Cited

U.S. PATENT DOCUMENTS

| | | | | |
|---|---|---|---|---|
| 5,408,190 A | * | 4/1995 | Wood | H01L 23/49838 324/750.19 |
| 2001/0024118 A1 | * | 9/2001 | Farnworth | H01L 23/49838 324/754.13 |
| 2021/0366889 A1 | * | 11/2021 | Lin | H01L 24/16 |

* cited by examiner

*Primary Examiner* — Paresh Patel
(74) *Attorney, Agent, or Firm* — McClure, Qualey & Rodack, LLP (57) ABSTRACT

A testing device for testing an integrated circuit package is provided, including a printed circuit board having a first surface, a second surface, and multiple conductive layers between the first and second surfaces. A metal layer is formed on the second surface and is electrically connected to one of the conductive layers that is grounded. A testing socket is disposed over the first surface. A conductive fastener secures the testing socket to the printed circuit board and is electrically connected to the metal layer. A cover is disposed over the testing socket to form a space for accommodating the integrated circuit package between the cover and the testing socket. The cover has a conductive surface in contact with the integrated circuit package. A conductive element assembly is disposed between the cover and the testing socket and is electrically connected to the conductive surface and the conductive fastener.

20 Claims, 7 Drawing Sheets

TESTING DEVICE AND METHOD FOR INTEGRATED CIRCUIT PACKAGE

BACKGROUND

Semiconductor integrated circuits (ICs) are incorporated into many electronic devices. IC packaging has evolved in such a way that multiple ICs can be vertically stacked in so-called three-dimensional (3D) packages in order to save horizontal area on a printed circuit board (PCB). An alternative packaging technique, referred to as a 2.5D package, may use an interposer, which may be formed from a semiconductor material such as silicon, for coupling one or more dies to a substrate. A plurality of IC chips, which may be of heterogeneous technologies, are mounted on the interposer. Connections among the various ICs are routed through conductive patterns in the interposer. These interposer and stacked IC packaging techniques are called 2.5D-IC and 3D-IC, respectively.

In semiconductor IC manufacturing, ICs are conventionally tested during manufacturing and prior to shipment to ensure proper operation. In a testing procedure, a tester is configured to generate testing signals. The tester is coupled to a testing device (sometimes called a prober), which has probes that provide testing signals for a device-under-test (DUT) such as a 2.5D-IC or 3D-IC package.

Although existing testing devices and methods for testing IC packages have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For brevity, references to 3D-ICs made below will be understood to encompass both 2.5D-ICs (including a semiconductor interposer) and 3D-ICs (including vertically stacked dies), unless expressly indicated otherwise.

As 3D-ICs are formed by a plurality of dies (or chip layers) having varying process techniques (e.g., composite materials) and/or supply voltages on different dies, high-voltage static electricity, commonly referred to as electrostatic discharge (ESD), can pass through the IC package and/or testing device. ESD causes a sudden and momentary electric current that flows between two objects at different electrical potentials. ESD can damage sensitive electronic components in the 3D-IC and testing device, causing performance degradation or failure. In addition, when testing 3D-ICs for the 5th generation (5G) mobile network applications, some noise (such as radio frequency (RF) noise, thermal noise, flicker noise, shot noise, etc.) will inevitably be generated by the tester, which needs to be shielded. Otherwise, the testing procedure will be adversely affected.

Therefore, the present disclosure is generally directed to providing ESD protection and/or noise shielding for IC packages (especially for 3D-IC packages) and associated testing device. A testing device (for testing IC packages) having an ESD protection and/or noise shielding design is provided in accordance with various exemplary embodiments of the disclosure. Variations of the embodiments are discussed. Throughout the various views and illustrative embodiments, like reference numbers are used to designate like elements. In accordance with some embodiments, a testing device has a newly created conductive path from the top cover through the testing socket to a ground layer of the printed circuit board (PCB) for better preventing ESD and/or shielding various noises during testing. Accordingly, the protection of the testing device and the tested IC packages is increased, and the reliability of testing procedure is improved.

Figure 1:
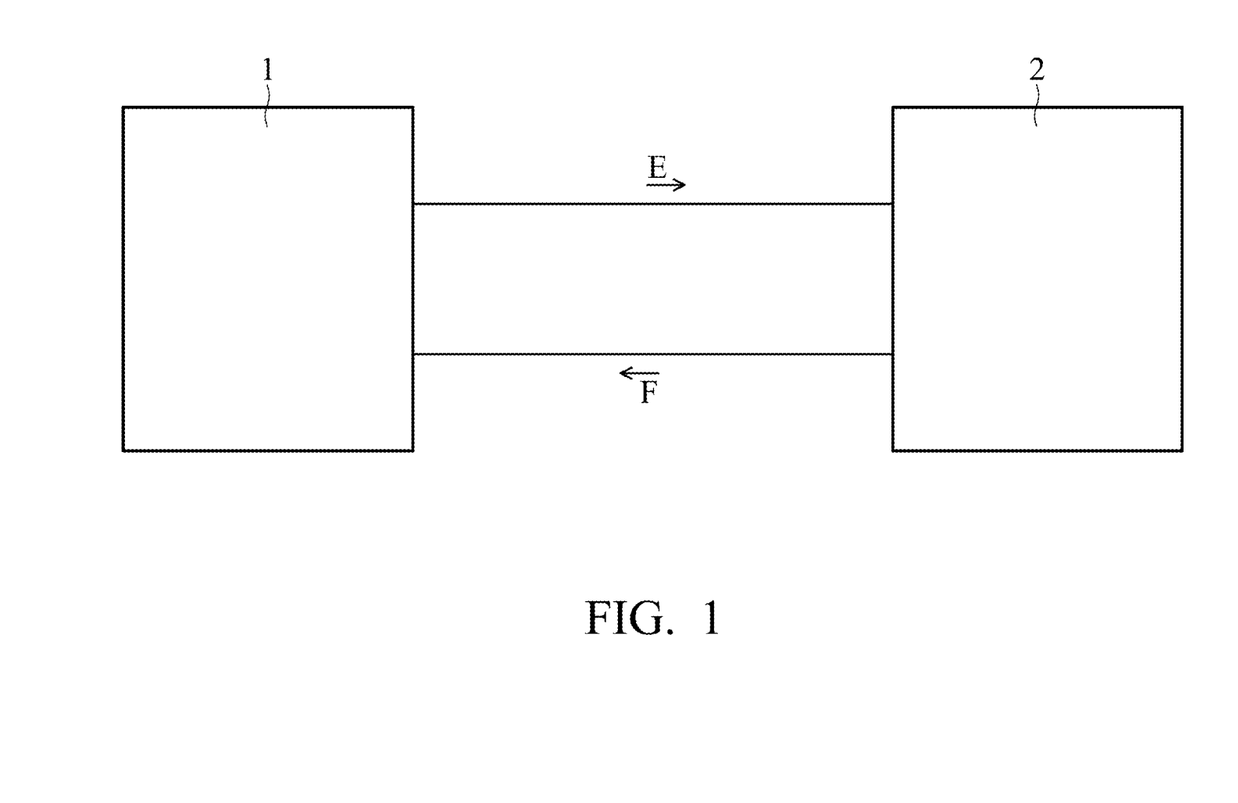
FIG. 1 is a schematic view of a testing system in accordance with some embodiments of the present disclosure.

FIG. 1 is a schematic view of a testing system in accordance with some embodiments of the present disclosure. The testing system includes a testing device 1 and a testing apparatus (or called a tester) 2. The testing device 1 is coupled to the testing apparatus 2 through an electrical connection interface (not shown). In some embodiments, the testing apparatus 2 is used for providing a feeding (or testing) signal F to the testing device 1 for testing an IC package (device-under-test, DUT), and then the testing device 1 returns an excited signal E to the testing apparatus 2. As such, the performance of the IC package in response to the feeding signal F may be tested to determine whether the IC package is qualified for design requirement.

Figure 2:
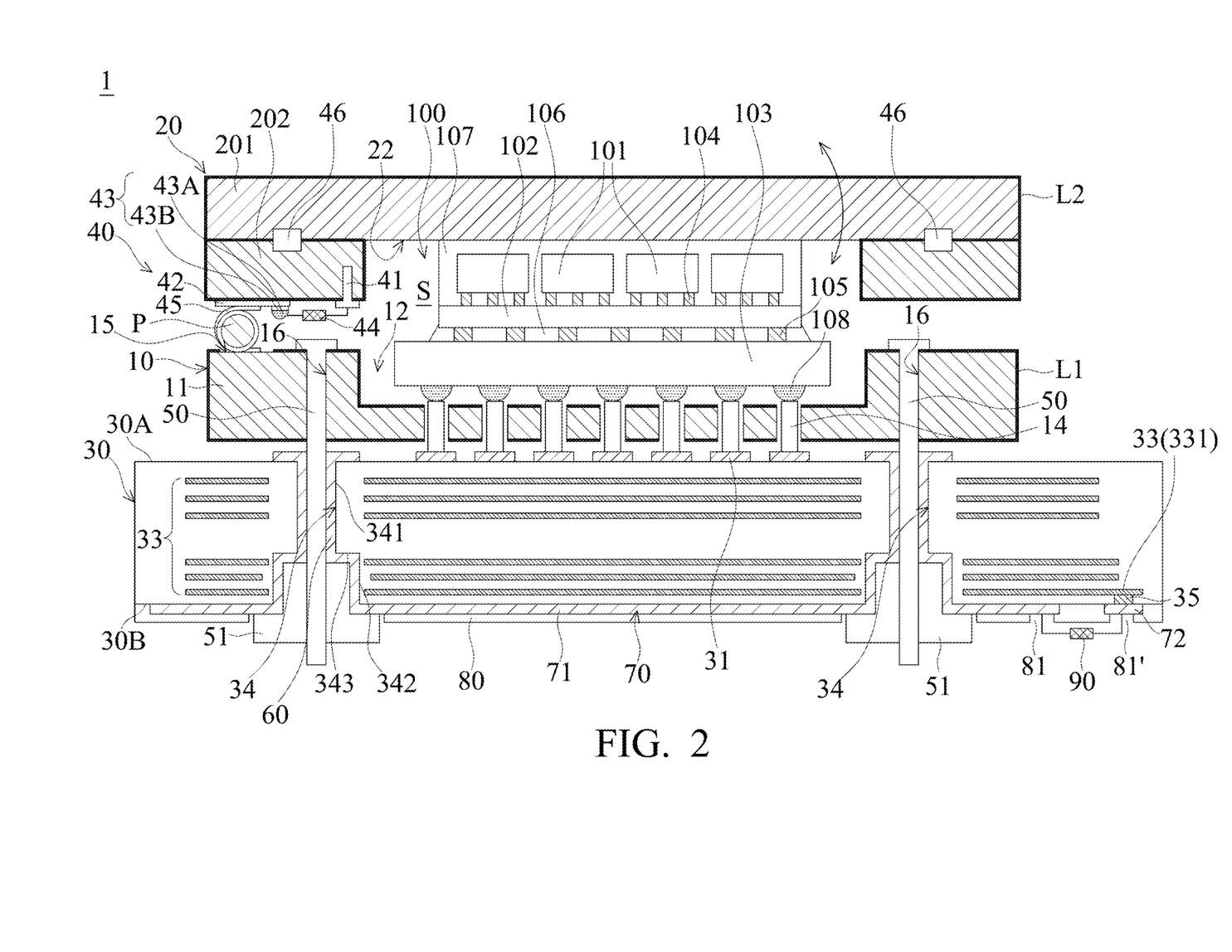
FIG. 2 is a cross-sectional view of a testing device testing an integrated circuit (IC) package in accordance with some embodiments of the present disclosure.

FIG. 2 illustrates a cross-sectional view of the testing device 1 testing an IC package 100 in accordance with some embodiments of the present disclosure. In some embodiments, the testing device 1 is used to perform a final test (FT) on the IC package 100, but the disclosure is not limited thereto.

In some embodiments, the tested IC package 100 is a 3D-IC package. For example, FIG. 2 illustrates an example of a 2.5D-IC package 100 in which multiple dies (or IC chips) 101 are coupled to an interposer 102, which is in turn mounted on a package substrate 103. The dies 101 may be bonded to the interposer 102 using small conductive bumps 104 (such as solder bumps), which may be referred to as "microbumps", or the bonding between the dies 101 and the interposer 102 may be direct metal-to-metal (such as copper-to-copper) bonding. Conductive bumps 105 may also be used to couple the interposer 102 to the package substrate 103. Moreover, an underfill 106 may be supplied into the gap between the conductive bumps 105 to protect the conductive bumps 105. An encapsulation layer 107 made of molding compound may be formed over the interposer 102 to cover and protect the dies 101. Also, the IC package 100 has a plurality of electrical connectors 108 disposed on a contact surface (e.g., the lower surface shown) of the package substrate 103, which are in contact with probes 14 of the testing device 1 during testing (which will be described further later).

It should be appreciated that the IC package 100 shown in FIG. 2 is merely an illustrative example, and other 2.5D-IC or 3D-IC package configurations may also be used. For example, in some cases, the IC package 100 may be a System on Integrated Chip (SoIC) package, an integrated fan-out (InFO) package, a Chip on Wafer on Substrate (CoWoS) package, or the like. These packaging techniques are well known in the art and therefore not described herein.

In some embodiments, the testing device 1 includes a testing socket 10 for testing the DUT (IC package 100). The testing socket 10 includes a bottom fixture (or referred to as a main body) 11 having a recess 12 formed on a top surface (e.g., the upper surface shown) of the bottom fixture 11 to accommodate the IC package 100 as shown in FIG. 2, during testing. In some embodiments, the testing device 1 includes a (top) cover 20 disposed over the testing socket 10. The cover 20 and the underlying testing socket 10 define an accommodating space S therebetween, and the accommodating space S is communicated with the underlying recess 12. As such, the cover 20 can protect the IC package 100 received in the accommodating space S during testing.

In some embodiments, the cover 20 is pivotally connected to the testing socket 10, and hence the cover 20 is rotatable with respect to the testing socket 10 (as shown by the double arrow in FIG. 2). That is to say, the cover 20 and the testing socket 10 are connected with each other via one or more pivot joints such as shafts P (referring to FIG. 3, the shafts P can pass through extended match parts 13 of the testing socket 10 and extended match parts 21 of the cover 20 to pivotally connect the cover 20 and the testing socket 10), so that the cover 20 can be opened for placing the IC package 100 into the accommodating space S, and then can be closed for protecting the IC package 100 during testing.

The cover 20 and the testing socket 10 may be made of or include rigid materials that can provide sufficient support and protection for the IC package 100, such as metal materials (for example, stainless steel or aluminum (Al) alloy, etc.). In some embodiments, the outer surfaces of the testing socket 10 and the cover 20 are covered with insulating layers L1 and L2, respectively, as shown in FIG. 2. The insulating layers L1 and L2 are used to prevent the operator from receiving an electric shock when operating the testing device 1.

In some embodiments, the testing device 1 includes a (loadboard) printed circuit board (PCB) 30 disposed under the testing socket 10. The testing socket 10 may be secured on the PCB 30 through screws as shown in FIG. 2, although other mechanisms such as clamps may also be used. In some embodiments, the testing socket 10 also includes a plurality of probes 14 (for example, pogo pins including signal pins and ground pin(s)) embedded in the bottom fixture 11 (and below the accommodating space S), which are used for probing the IC package 100 (for example, by contacting the electrical connectors 108) during testing. The probes 14 may be electrically connected to metal pads (or bumps) 31 formed on the upper surface 30A of the PCB 30, and the metal pads 31 may further be electrically connected to the testing apparatus 2 (in FIG. 1) through metal pads (or bumps) 32 (see FIG. 4) formed on the lower surface 30B of the PCB 30 and multiple conductive layers 33 (including signal layers and ground layer(s), which are respectively coupled to the signal terminals and ground terminal(s) of the testing apparatus 2) within the PCB 30. As such, the testing procedure illustrated in FIG. 1 can be performed by the testing device 1 and associated testing apparatus 2.

As mentioned above, the occurrence of ESD during testing is a problem for the tested 3D-IC package 100 and associated testing device 1. It has been found that static electricity tends to accumulate in the non-conductive material of the 3D-IC package 100 (for example, the top encapsulation layer 107 shown in FIG. 2), and cannot be released smoothly through the above ground pin(s) and ground layer(s) of the testing device 1. To this end, a new conductive path for better discharging static electricity accumulated in (the encapsulation layer 107 of) the IC package 100 (to prevent high static electricity voltage level from forming) is provided, in some testing device embodiments.

Figure 3:
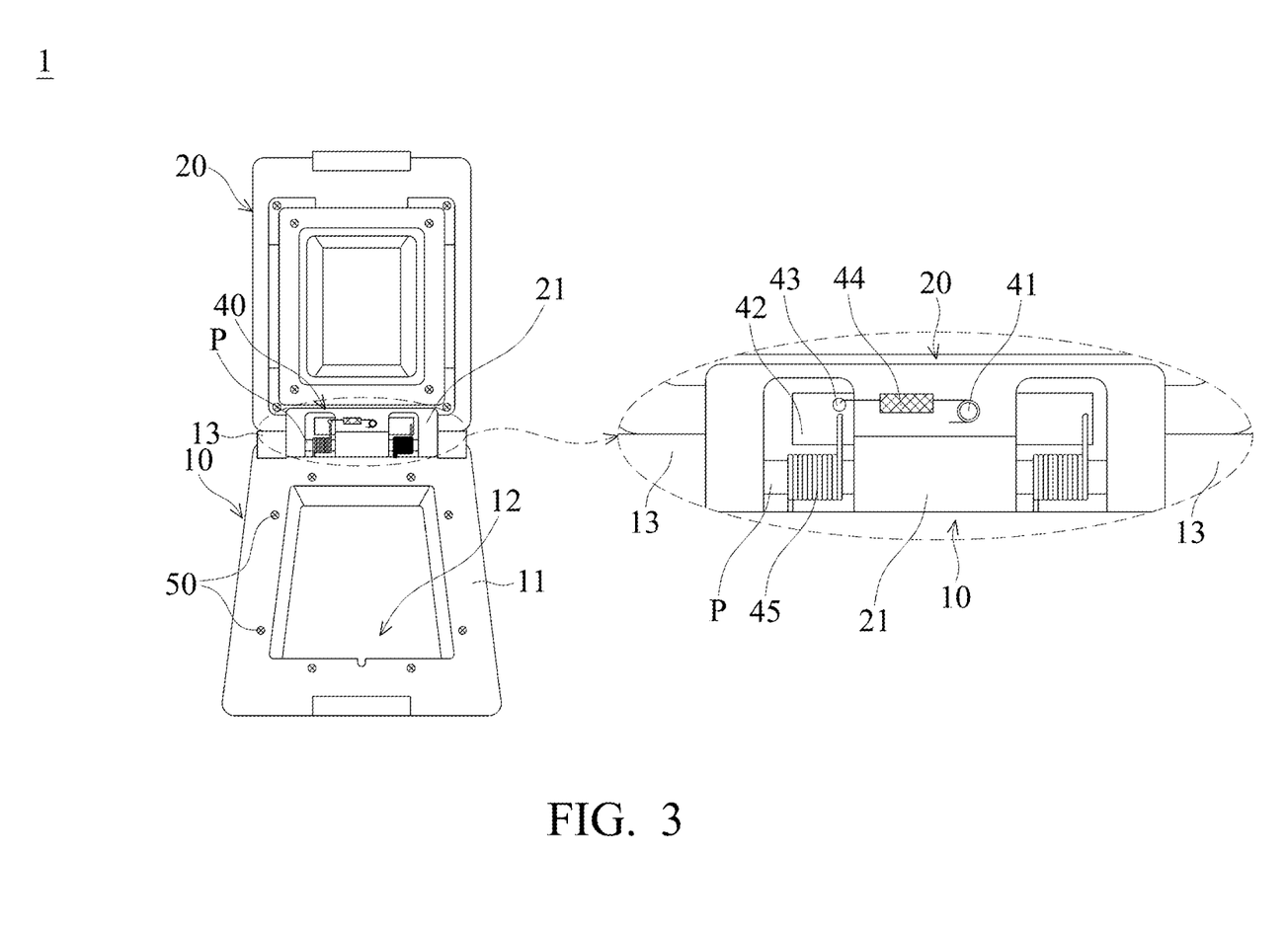
FIG. 3 is a perspective view of the testing device (with the cover opened) in accordance with some embodiments of the present disclosure, and shows the arrangement of a conductive element assembly adjacent to the shafts.
Figure 4:
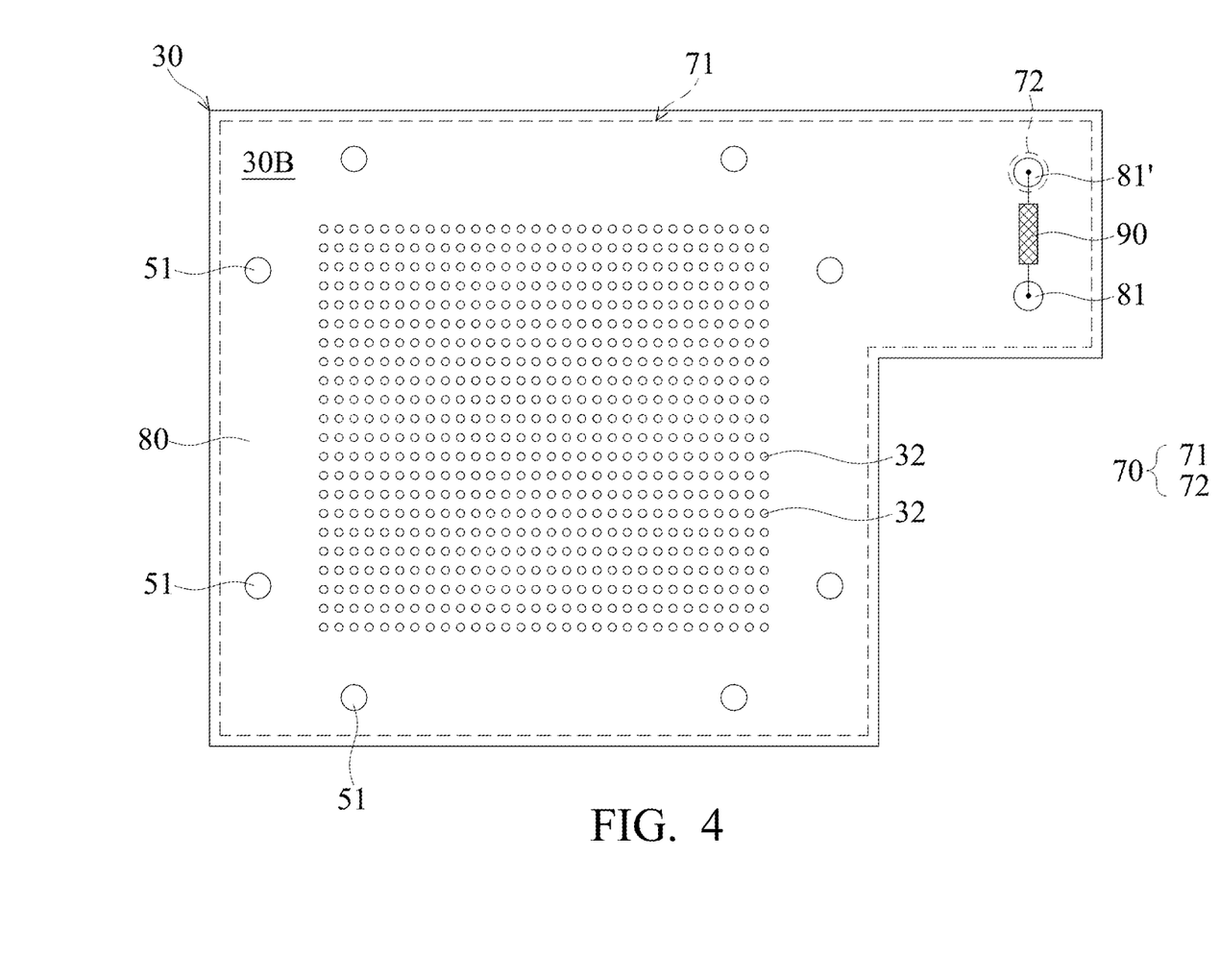
FIG. 4 is a bottom view of the printed circuit board (PCB) of the testing device in accordance with some embodiments of the present disclosure.

It should be first understood that new conductive path basically consists of a first (upper) path part for coupling the cover 20 to the testing socket 10 (i.e., used to discharge static electricity from the cover 20 to the testing socket 10), a second (lower) path part arranged on the lower surface 30B of the PCB 30 and coupled to the PCB 30 ground layer (i.e., used to discharge static electricity from the PCB 30 to the ground), and a third (middle) path part for coupling the testing socket 10 to the second path part (i.e., used to discharge static electricity from the testing socket 10 to the PCB 30), which will be described below with reference to FIG. 2, FIG. 3, and FIG. 4. FIG. 3 illustrates a perspective view of the testing device 1 (with the cover 20 opened) in accordance with some embodiments of the present disclosure, and shows the arrangement of a conductive element assembly (part of the first path part) adjacent to the shaft(s) P. FIG. 4 illustrates a bottom view of the PCB 30 of the testing device 1 in accordance with some embodiments of the present disclosure.

For discharging static electricity from the cover 20, it is needed to establish electrical connection between the cover 20 and the IC package 100. In some embodiments, the cover 20 has a conductive (metal) surface 22 exposed through the insulating layer L2 and in contact with the top encapsulation layer 107 of the IC package 100 during testing, as shown in FIG. 2. As such, electrical connection between the cover 20 and the IC package 100 is achieved. The conductive surface 22 may be exposed by removing a portion of the insulating layer L2 using grinding or other suitable techniques.

A conductive element assembly 40 is provided between the cover 20 and the testing socket 10 in order to electrically connect the cover 20 to the testing socket 10, in accordance with some embodiments. The conductive element assembly 40 may be arranged adjacent to the shafts P as shown in FIGS. 2 and 3, although it may also be arranged in other suitable locations. In various embodiments, the conductive element assembly 40 includes at least one conductive member 41, at least one metal foil 42, at least one conductive connector 43, at least one circuit element 44, and at least one conductive torsion spring 45. It should be understood that some additional elements can be added into the conductive element assembly 40 in different embodiments, and some of the elements described below can be replaced or eliminated in other embodiments.

The conductive member 41 is disposed on (or outside) the cover 20 and electrically connected to the conductive surface 22, in accordance with some embodiments. In some embodiments, a portion of the conductive member 41 passes through the insulating layer L2 and enters the cover 20, and another portion of the conductive member 41 is exposed at the insulating layer L2 as shown in FIG. 2. As such, the conductive member 41 can be electrically connected to the conductive surface 22 through the metal material of the cover 20. In some embodiments, the conductive member 41 is a conductive screw made of metal materials (for example, stainless steel or Al alloy, etc.) without an insulating coating thereon, although other suitable mechanisms may also be used.

In some embodiments, the cover 20 may consist of or include a plurality of separated cover parts (e.g., a cover part 201 over the IC package 100 and another cover part 202 around the IC package 100) as shown in FIG. 2. In this case, one or more conductive members 46 are arranged between and contacting the cover parts (for example, the cover parts 201 and 202 respectively have conductive surfaces exposed through the insulating layer L2 and in contact with the conductive member 46) to couple the cover parts. As such, the conductive member 41 is also electrically connected to the conductive surface 22 of the cover 20 through the metal material of the cover parts and the conductive member(s) 46. In some embodiments, the conductive member 46 is a conductive spring made of metal materials (for example, stainless steel or Al alloy, etc.) without an insulating coating thereon, although other suitable mechanisms may also be used.

The metal foil (for example, an gold (Au) foil or copper (Cu) foil) 42 is attached to the insulating layer L2 using an adhesion or glue (not shown), and is separated from the conductive member 41, in accordance with some embodiments. The conductive connector 43 is formed on the metal foil 42. In some embodiments, the conductive connector 43 includes a conductive element 43A and a connection element 43B. The conductive element 43A is fixed on top of the metal foil 42 by the connection element 43B. In some embodiments, the conductive element 43A is a solder ball, and the connection element 43B is a Cu—Sn (tin) or Au—Sn intermetallic compound (IMC) used for bonding the conductive element 43A to the metal foil 42, although other suitable materials may also be used. The conductive element 43A and the connection element 43B may be formed using an electroplating process, a deposition process, a coating process, or other applicable processes.

The circuit element 44 is arranged over the insulating layer L2 (i.e., outside the cover 20) and connected to the conductive member 41 and the conductive connector 43, in accordance with some embodiments. In some embodiments, the circuit element 44 is an active component (such as a diode) or a passive component (such as a resistor). The circuit element 44 has two terminals, which are coupled to the conductive member 41 and the conductive connector 43, respectively. For example, one terminal of the circuit element 44 can be wound around the portion of the conductive member 41 (for example, a screw) exposed at the insulating layer L2, and the other terminal is bonded or soldered to the conductive element 43A (for example, a solder ball) of the conductive connector 43 as shown in FIGS. 2 and 3. Accordingly, the circuit element 44 can control or reduce the speed of ESD charges along the conductive path, thereby preventing damage to sensitive electronic components in the tested IC package 100 and the testing device 1.

Although the drawings illustrate one circuit element 44, two or more circuit elements 44 may be arranged between and connected to the conductive member 41 and the conductive connector 43, and the circuit elements 44 may be connected in series or parallel, depending on design requirements (for example, different amounts of ESD current).

The conductive torsion spring 45 is wound around the shaft P and connected to the cover 20 and the testing socket 10, in accordance with some embodiments. The conductive torsion spring 45 is used to provide a torsion force that facilitates the opening and closing operations of the cover 20.

In some embodiments, the conductive torsion spring 45 is also arranged so that one end of the conductive torsion spring 45 contacts a portion of the metal foil 42 not occupied by the conductive connector 43, and the other end contacts the metal material (a conductive (metal) surface 15) of the testing socket 10 exposed through the insulating layer L1, as shown in FIG. 2. The method for exposing the conductive surface 15 of the testing socket 10 may be the same as that for exposing the conductive surface 22 of the cover 20 as described above. In some embodiments, the conductive torsion spring 45 is made of or includes metal materials (for example, stainless steel or Al alloy, etc.) without an insulating coating thereon.

With the above design, the electrical connection between the cover 20 and the testing socket 10 is realized by the conductive element assembly 40.

The following will describe the design of the second (lower) path part and third (middle) path part of the new conductive path.

In some embodiments, multiple conductive fasteners 50, such as conductive screws made of metal materials (for example, stainless steel or Al alloy, etc.) without an insulating coating thereon, are provided to secure the testing socket 10 to the PCB 30. For example, the conductive fasteners 50 can pass through openings 16 (penetrating the upper and lower surfaces of the socket shown) in the testing socket 10 and through holes 34 (penetrating the upper surface 30A and the lower surface 30B) in the PCB 30 to fix the testing socket 10 on the upper surface 30A as shown in FIG. 2. The openings 16 and the through holes 34 may be formed by mechanical drilling (such as laser drilling) or other suitable processes.

In some embodiments, the conductive fasteners 50 are in contact with the sidewalls of the openings 16, and hence are electrically connected to the testing socket 10 (as well as the connected conductive torsion spring 45) as shown in FIG. 2.

In some embodiments, the tip of each conductive fastener 50 extends beyond the lower surface 30B of the PCB 30, and multiple nuts 51 are provided to connect the respective conductive fasteners 50 (for example, conductive screws). A part of the nut 51 may extend into the corresponding through hole 34 as shown in FIG. 2. In some embodiments, the size and shape of the through hole 34 match the receiving conductive fastener 50 and nut 51. For example, referring to FIG. 2, the sidewall of the through hole 34 has a narrower portion 341 (adjacent to and perpendicular to the upper surface 30A) for receiving the conductive fastener 50, a wider portion 342 (adjacent to and perpendicular to the lower surface 30B) for receiving the nut 51, and a middle (horizontal) portion 343 between and connected to the portions 341 and 342.

In some embodiments, a conductive (metal) layer 60 made of metal materials (e.g., copper) is formed on the sidewall of the through hole 34, and is in contact with the receiving conductive fastener 50. For example, the conductive layer 60 can be conformally formed on the narrower portion 341, wider portion 342, and the middle portion 343 of the sidewall by electroplating, deposition or other suitable processes, as shown in FIG. 2. In some embodiments, the formed conductive layer 60 extends to the lower surface 30B of the PCB 30 for coupling to another conductive layer (e.g., a metal layer 70) covering the lower surface 30B, which will be described below.

In some embodiments, a conductive (metal) layer 70 made of metal materials (e.g., copper) is also formed on the lower surface 30B of the PCB 30. In some embodiments, the conductive layer 70 (depicted in dashed lines in FIG. 4) includes a conductive (metal) sheet 71 and a conductive (metal) pad 72 separated from the conductive sheet 71. The shape of the conductive sheet 71 may match the shape of the PCB 30 as shown in FIG. 4. In other words, the conductive sheet 71 covers substantially the entire lower surface 30B of the PCB 30.

In some embodiments, as shown in FIG. 2, the conductive sheet 71 is connected to the conductive layer 60 so that the conductive fastener 50 (as well as the connected testing socket 10) can be coupled to the conductive sheet 71 through the conductive layer 60. The conductive pad 72 is electrically connected to one ground layer 331 of the conductive layers 33 of the PCB 30 through a conductive via 35 in the PCB 30. The materials and formation method of the conductive via are well known in the art and therefore not described herein.

The conductive layer 70 (including separate conductive sheet 71 and conductive pad 72) may be formed by electroplating, deposition or other suitable processes, and then patterned by a mask-defined photoresist etching process, although other suitable processes may also be used. In some embodiments, the conductive layer 70 and the metal pads 32 are at the same level (layer), and are formed in the same process step. In some embodiments, insulating rings (not shown) are formed around the conductive pad 72 and the metal pads 32 to avoid short circuit with the conductive sheet 71.

In some embodiments, an insulating layer 80 (e.g., a solder mask layer) is formed over the conductive layer 70 by a deposition or coating process to protect the conductive layer 70. In some embodiments, the insulating layer 80 partially covers the conductive sheet 71 and the conductive pad 72. For example, the insulating layer 80 has openings 81 and 81' exposing the underlying conductive sheet 71 and conductive pad 72, respectively, as shown in FIG. 2 and FIG. 4. The openings 81 and 81' may be made by removing a portion of the formed insulating layer 80 using a mask-defined photoresist etching process. Although not particularly shown, the metal pads 32 on the lower surface 30B may also be exposed through openings of the insulating layer 80 to be coupled to the testing apparatus 2.

In some embodiments, a circuit element 90 is arranged over the insulating layer 80 (i.e., outside the PCB 30) and connected to the conductive sheet 71 and the conductive pad 72 exposed through the openings 81 and 81' of the insulating layer 80, in accordance with some embodiments. In some embodiments, the circuit element 90 is an active component (such as a diode) or a passive component (such as a resistor). The circuit element 90 has two terminals, one of which is bonded or soldered to the conductive sheet 71, and the other of which is bonded or soldered to the conductive pad 72 exposed through the insulating layer 80. Accordingly, the circuit element 90, similar to the circuit element 44, can also control or reduce the speed of ESD charges along the conductive path, thereby preventing damage to sensitive electronic components in the tested IC package 100 and the testing device 1. In some embodiments, one of the circuit elements 44 and 90 may be omitted.

With the above design, a new conductive path from the conductive surface 22 of the top cover 20 through the testing socket 10 to a ground layer 331 of the PCB 30 is provided. Through such a conductive path, static electricity built up on the IC package 100 can be discharged easily to prevent high static electricity voltage level from forming, for example, when the conductive surface 22 of the cover 20 is in contact with the encapsulation layer 107 of the IC package 100 during testing. As a result, a better ESD protection for the tested IC package 100 and associated testing device 1 during testing is achieved.

In some cases where the IC package 100 is a 3D-IC for 5G mobile network applications, the feeding signal F from the testing apparatus 2 is mmwave signal (i.e. having wavelength in millimeter scale), and some noise (such as RF noise, but the disclosure is not limiter thereto) will inevitably be generated by the testing apparatus 2. The above conductive path may also form a conductive shield around the testing device 1 (as well as the IC package 100) to shield the noise from the testing apparatus 2. As such, the reliability of the testing procedure performed by the testing device 1 is also improved.

Figure 5:
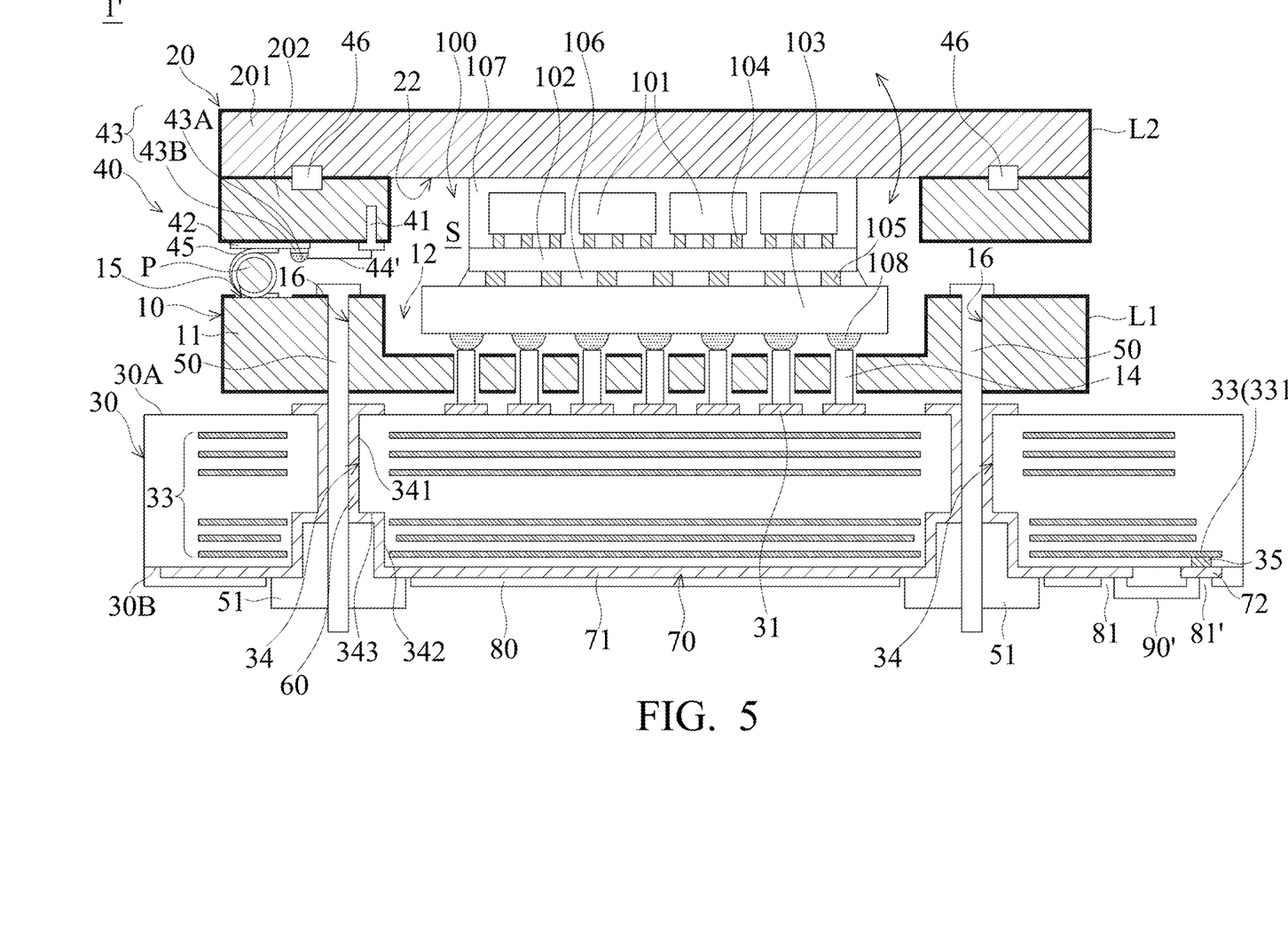
FIG. 5 is a cross-sectional view of a testing device in accordance with some embodiments of the present disclosure.

FIG. 5 is a cross-sectional view of a testing device 1' in accordance with some embodiments of the present disclosure. It should be appreciated that most of the arrangements in FIG. 5 are the same as those in FIG. 2, so only the different parts are described here. In FIG. 5, a circuit element 44' is used to replace the circuit element 44 in FIG. 2, and a circuit element 90' is used to replace the circuit element 90 in FIG. 2. The circuit element 44' is a connecting wire with two terminals coupled to the conductive member 41 and the conductive connector 43, respectively. Also, the circuit element 90' is a connecting wire with two terminals respectively coupled to the conductive sheet 71 and the conductive pad 72 exposed through the insulating layer 80.

Accordingly, a new conductive path from the conductive surface 22 of the top cover 20 through the testing socket 10 to a ground layer 331 of the PCB 30 is also provided. It should be appreciated that the conductive path shown in FIG. 5 may also form a conductive shield around the testing device 1 (as well as the IC package 100) to shield the noise from the testing apparatus 2, similar to the embodiments of FIG. 2. However, it may be more suitable for situations where there is no ESD issue (as no active or passive component is provided to control the speed of ESD current).

Although not particularly shown, in some other embodiments, one of the circuit element 44/44' and the circuit element 90/90' may be an active or passive component (for example, a diode or a resistor), and the other may be a connecting wire. This allows the newly provided conductive path to also be used for both ESD protection and noise shielding.

Figure 6:
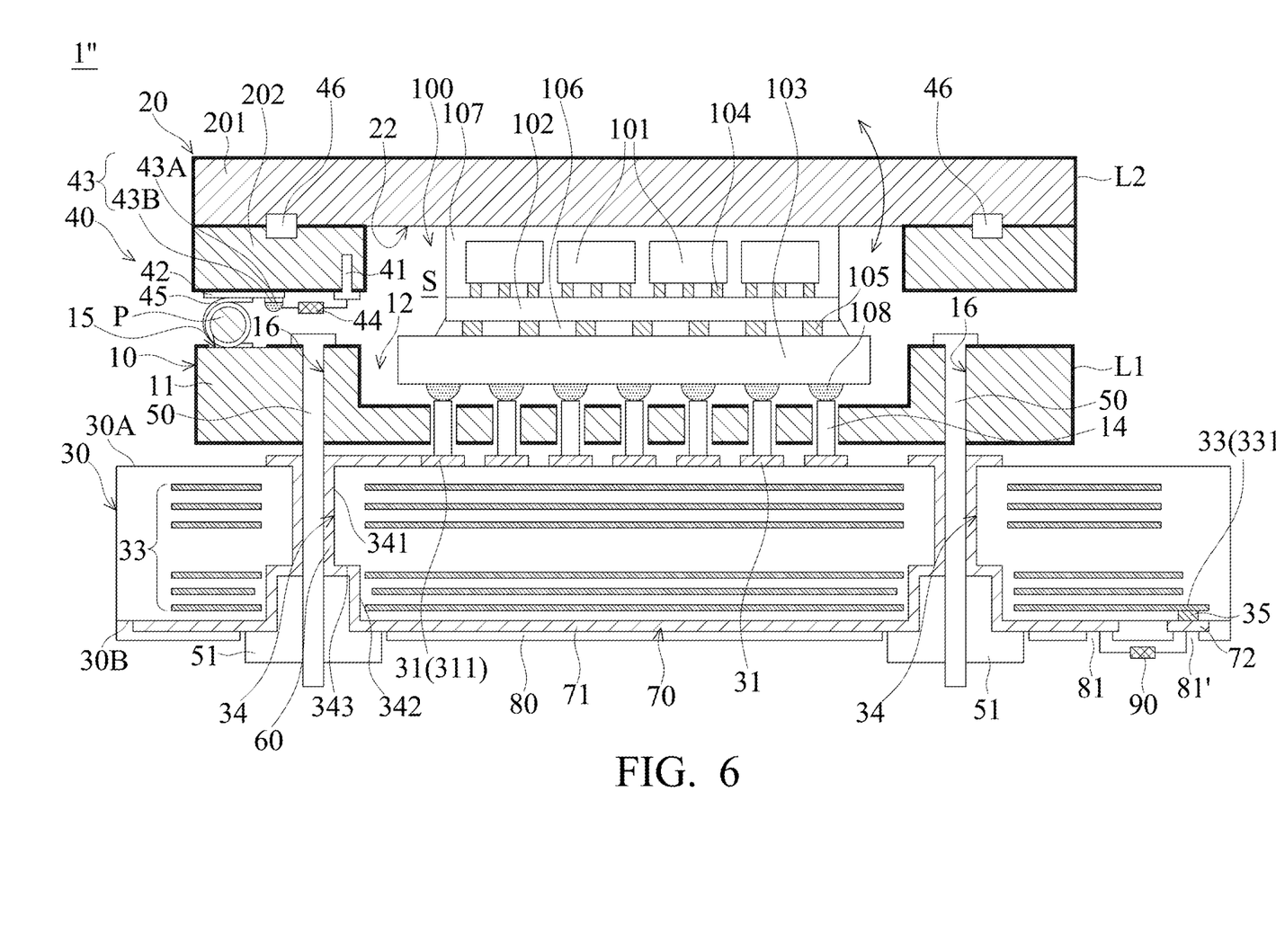
FIG. 6 is a cross-sectional view of a testing device in accordance with some embodiments of the present disclosure.

Many variations and/or modifications can be made to embodiments of the disclosure. For example, FIG. 6 is a cross-sectional view of a testing device 1" in accordance with some embodiments of the present disclosure. The testing device 1" differs from the testing device 1 in FIG. 2 only in that the conductive (metal) layer 60 is not only formed on the sidewall of the through hole 34, but also formed to extend to the upper surface 30A of the PCB 30 and connect one ground pad 311 (i.e., coupled with one ground pin of the testing socket 10) of the metal pads 31. As such, an additional ESD path is provided, and the circuit element 90 in the path can also control or reduce the ESD speed along the conductive path, thereby preventing damage to sensitive electronic components in the tested IC package 100 and the testing device 1.

Figure 7:
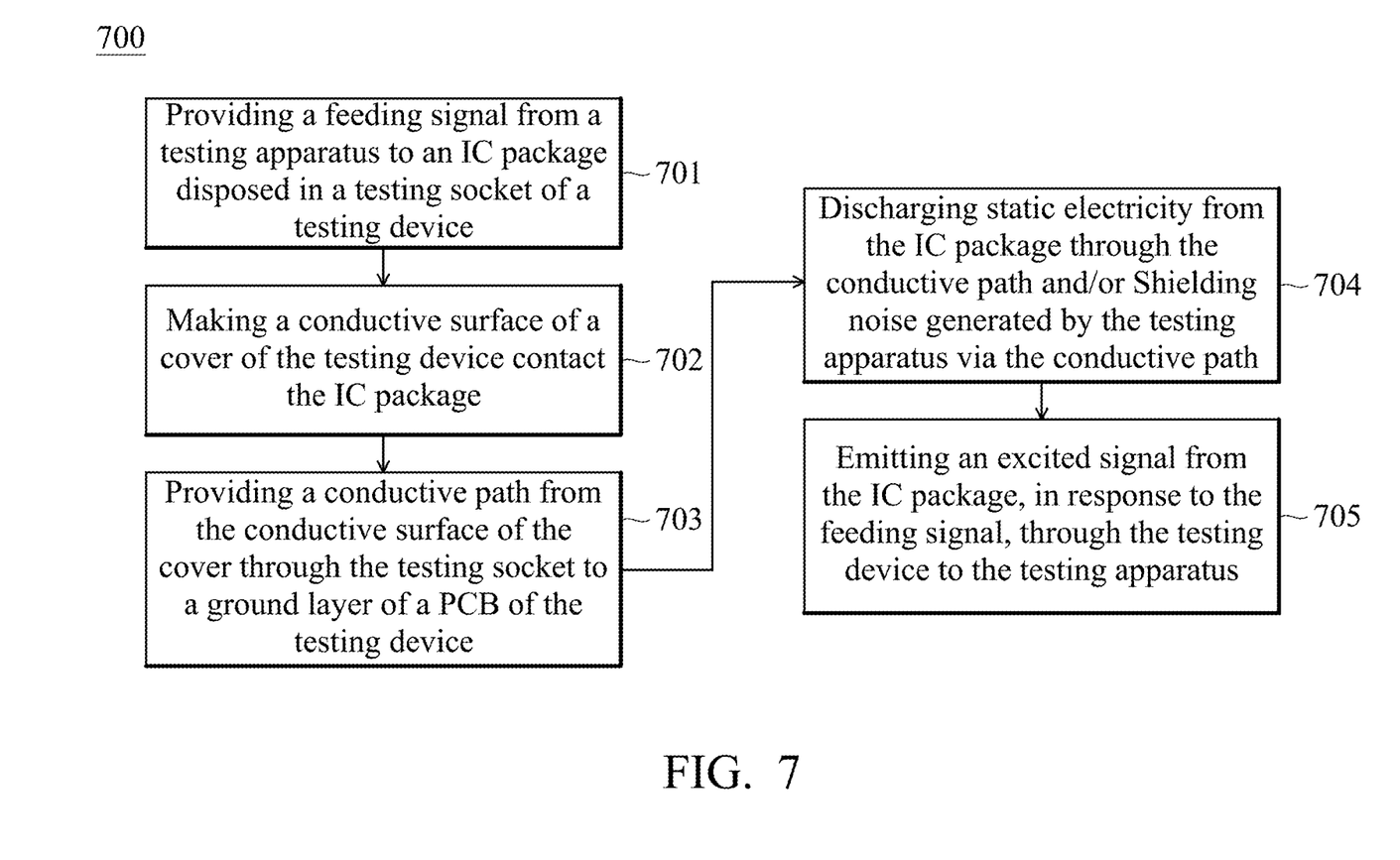
FIG. 7 is a simplified flowchart of a method of testing an IC package, in accordance with some embodiments.

FIG. 7 is a simplified flowchart of a method 700 of testing an IC package, in accordance with some embodiments. For illustration, the flow chart will be described along with the drawings shown in FIGS. 1, 2, and 5. The method 700 includes operation 701, in which a feeding signal F is provided from the testing apparatus 2 to an IC package 100 (DUT) disposed in the testing socket 10 of the testing device 1/1'. The method 700 also includes operation 702, in which the exposed conductive surface 22 of the cover 20 is brought into contact with the IC package 100 (for example, the top encapsulation layer 107) during testing. The conductive surface 22 may be exposed by removing a portion of the insulating layer L2 covering the cover 20. The method 700 also includes operation 703, in which a conductive path from the conductive surface 22 of the cover 20 through the testing socket 10 to a ground layer 331 of the PCB 30 is provided. The conductive path basically includes a first (upper) path part for coupling the cover 20 to the testing socket 10, a second (lower) path part arranged on the lower surface 30B of the PCB 30 and coupled to ground layer 331 of the PCB 30, and a third (middle) path part for coupling the testing socket 10 to the second path part. The details of the newly created conductive path have been described above, and are not repeated herein. The method 700 further includes operation 704, in which static electricity built up on the IC package 100 may be discharged through the conductive path and/or various noises generated by the testing apparatus 2 may be shielded by the conductive path, during testing. In addition, the method 700 includes operation 705, in which the excited signal E is emitted from the IC package 100, in response to the feeding signal F, through the testing device 1 to the testing apparatus 2.

In summary, a testing device for testing an IC package (for example, a 3D-IC package, but the disclosure is not limited thereto) is provided in some embodiments of the present disclosure. The testing device has a newly created conductive path from the top cover through the testing socket to a ground layer of the PCB for better controlling or preventing ESD and/or shielding various noises during testing. Accordingly, the protection of the testing device and the tested IC packages is increased, and the reliability of testing procedure is improved.

Moreover, one or more adaptable circuit elements (e.g., active components, passive components, or connecting wires) are alternatively (i.e., adjustably) provided in the conductive path depending on various design requirements (for example, for ESD protection and/or noise shielding) in some embodiments, so the testing device is more convenient to use.

A testing device for testing an integrated circuit package is provided in accordance with some embodiments. The testing device includes a printed circuit board, a testing socket, a cover, a first metal layer, a conductive fastener, and a conductive element assembly. The printed circuit board has a first surface, a second surface opposite to the first surface, and multiple conductive layers between the first and second surfaces. The first metal layer is formed on the second surface and is electrically connected to one of the conductive layers that is grounded. The testing socket is disposed over the first surface. The conductive fastener passes through the testing socket and the printed circuit board to secure the testing socket to the printed circuit board. The conductive fastener is electrically connected to the first metal layer. The cover is disposed over the testing socket to form a space for accommodating the integrated circuit package between the cover and the testing socket. The cover has a conductive surface in contact with the integrated circuit package. The conductive element assembly is disposed between the cover and the testing socket and is electrically connected to the conductive surface and the conductive fastener.

A testing device for testing an integrated circuit package is provided in accordance with some embodiments. The testing device includes a printed circuit board, a testing socket, a cover, a conductive layer, an insulating layer, a first circuit element, a conductive fastener, a conductive member, a conductive element, a second circuit element, and a conductive torsion spring. The printed circuit board has a first surface and a second surface opposite to the first surface. The conductive layer is formed on the second surface. The conductive layer includes a conductive sheet and a conductive pad that is grounded and separated from the conductive sheet. The insulating layer covers the conductive layer and partially exposes the conductive sheet and the conductive pad. The first circuit element is disposed over the insulating layer, and the terminals of the first circuit element are respectively bonded to the conductive sheet and the conductive pad exposed through the insulating layer. The testing socket is disposed over the first surface. The conductive fastener passes through the testing socket and the printed circuit board to secure the testing socket to the printed circuit board. The conductive fastener is electrically connected to the testing socket and the conductive sheet. The cover is pivotally connected to the testing socket by a shaft to form a space for accommodating the integrated circuit package between the cover and the testing socket. The cover has a conductive surface in contact with the integrated circuit package. The conductive member is disposed on the cover and electrically connected to the conductive surface. The conductive element is disposed on the cover and separated from the conductive member. The second circuit element is arranged outside the cover, and terminals of the second circuit element are electrically connected to the conductive member and the conductive element, respectively. The conductive torsion spring is wound around the shaft. A first end of the conductive torsion spring contacts the conductive element, and a second end of the conductive torsion spring contacts the testing socket.

A method for testing an integrated circuit package is provided in accordance with some embodiments. The method includes providing a feeding signal from a testing apparatus to the integrated circuit package disposed in a testing socket of a testing device. The testing device comprises the testing socket, a cover disposed over the testing socket, and a printed circuit board disposed below the testing socket. The method also includes making a conductive surface of the cover contact the integrated circuit package. The method further includes providing a conductive path from the conductive surface of the cover through the testing socket to a ground layer of the printed circuit board. The method further includes discharging static electricity from the integrated circuit package through the conductive path and/or shielding noise generated by the testing apparatus via the conductive path. In addition, the method includes emitting an excited signal from the integrated circuit package, in response to the feeding signal, through the testing device to the testing apparatus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A testing device for testing an integrated circuit package, comprising:
    a printed circuit board having a first surface, a second surface opposite to the first surface, and a plurality of conductive layers between the first and second surfaces;
    a first metal layer formed on the second surface and electrically connected to one of the conductive layers that is grounded;
    a testing socket disposed over the first surface;
    a conductive fastener passing through the testing socket and the printed circuit board to secure the testing socket to the printed circuit board, wherein the conductive fastener is electrically connected to the first metal layer;
    a cover disposed over the testing socket to form a space for accommodating the integrated circuit package between the cover and the testing socket, wherein the cover has a conductive surface in contact with the integrated circuit package; and
    a conductive element assembly disposed between the cover and the testing socket and electrically connected to the conductive surface and the conductive fastener.

2. The testing device as claimed in claim 1, wherein the printed circuit board further has a through hole penetrating the first surface and the second surface, and a second metal layer formed on a sidewall of the through hole and extending to connect the first metal layer, and
    wherein the conductive fastener passes through the through hole and is electrically connected to the first metal layer through the second metal layer.

3. The testing device as claimed in claim 2, wherein the first metal layer comprises a metal sheet and a metal pad separated from the metal sheet, wherein the metal sheet is electrically connected to the second metal layer, and the metal pad is electrically connected to the conductive layer that is grounded, and
    wherein the testing device further comprises:
    a solder mask layer covering the first metal layer and partially exposing the metal sheet and metal pad; and
    a first circuit element disposed over the solder mask layer, wherein terminals of the first circuit element are respectively bonded to the metal sheet and the metal pad exposed through the solder mask layer.

4. The testing device as claimed in claim 3, wherein the first circuit element is an active component or a passive component.

5. The testing device as claimed in claim 3, wherein the first circuit element is a connecting wire.

6. The testing device as claimed in claim 1, wherein the cover is covered with an insulating layer, and the conductive surface of the cover is exposed through the insulating layer.

7. The testing device as claimed in claim 6, wherein the cover is pivotally connected to the testing socket by a shaft, and
    wherein the conductive element assembly is arranged adjacent to the shaft and comprises:
    a conductive member, wherein a first portion of the conductive member passes through the insulating layer and enters the cover, and a second portion of the conductive member is exposed at the insulating layer;
    a metal foil attached to the insulating layer;
    a conductive connector formed on the metal foil;
    a second circuit element disposed over the insulating layer, wherein terminals of the second circuit element are electrically connected to the second portion of the conductive member and the conductive connector, respectively; and
    a conductive torsion spring wound around the shaft, wherein a first end of the conductive torsion spring contacts the metal foil, and a second end of the conductive torsion spring contacts the testing socket, and wherein the conductive torsion spring is electrically connected to the conductive fastener through the testing socket.

8. The testing device as claimed in claim 7, wherein the second circuit element is an active component or a passive component.

9. The testing device as claimed in claim 7, wherein the second circuit element is a connecting wire.

10. The testing device as claimed in claim 1, wherein the cover includes a plurality of cover parts, and a conductive member disposed between and contacting the cover parts.

11. A testing device for testing an integrated circuit package, comprising:
    a printed circuit board having a first surface and a second surface opposite to the first surface;
    a conductive layer formed on the second surface, wherein the conductive layer comprises a conductive sheet, and a conductive pad that is grounded and separated from the conductive sheet;
    an insulating layer covering the conductive layer and partially exposing the conductive sheet and the conductive pad;
    a first circuit element disposed over the insulating layer, wherein terminals of the first circuit element are respectively bonded to the conductive sheet and the conductive pad exposed through the insulating layer;
    a testing socket disposed over the first surface;
    a conductive fastener passing through the testing socket and the printed circuit board to secure the testing socket to the printed circuit board, wherein the conductive fastener is electrically connected to the testing socket and the conductive sheet;

a cover pivotally connected to the testing socket by a shaft to form a space for accommodating the integrated circuit package between the cover and the testing socket, wherein the cover has a conductive surface in contact with the integrated circuit package;

a conductive member disposed on the cover and electrically connected to the conductive surface;

a conductive element disposed on the cover and separated from the conductive member;

a second circuit element arranged outside the cover, wherein terminals of the second circuit element are electrically connected to the conductive member and the conductive element, respectively; and a conductive torsion spring wound around the shaft, wherein a first end of the conductive torsion spring contacts the conductive element, and a second end of the conductive torsion spring contacts the testing socket.

12. The testing device as claimed in claim 11, wherein the first circuit element is an active or passive component, which is a diode or a resistor, or a connecting wire.

13. The testing device as claimed in claim 11, wherein the second circuit element is an active or passive component, which is a diode or a resistor, or a connecting wire.

14. The testing device as claimed in claim 11, wherein the printed circuit board further has a through hole penetrating the first surface and the second surface, and a second metal layer formed on a sidewall of the through hole and extending to connect the conductive sheet, and wherein the conductive fastener passes through the through hole and is electrically connected to the conductive sheet through the second metal layer.

15. The testing device as claimed in claim 14, wherein the sidewall of the through hole has a first portion adjacent to and perpendicular to the first surface, a second portion adjacent to and perpendicular to the second surface, and a middle portion between and perpendicular to the first and second portions, and wherein the second metal layer is conformally formed on the first portion, the middle portion, and the second portion.

16. A method for testing an integrated circuit package, comprising:

providing a feeding signal from a testing apparatus to the integrated circuit package disposed in a testing socket of a testing device, wherein the testing device comprises the testing socket, a cover disposed over the testing socket, and a printed circuit board disposed below the testing socket;

making a conductive surface of the cover contact the integrated circuit package;

providing a conductive path from the conductive surface of the cover through the testing socket to a ground layer of the printed circuit board;

discharging static electricity from the integrated circuit package through the conductive path and/or shielding noise generated by the testing apparatus via the conductive path; and emitting an excited signal from the integrated circuit package, in response to the feeding signal, through the testing device to the testing apparatus.

17. The method as claimed in claim 16, wherein the cover is covered with an insulating layer, and the method further comprises:

removing a portion of the insulating layer to expose the conductive surface of the cover for contacting the integrated circuit package.

18. The method as claimed in claim 16, wherein the step of providing the conductive path further comprises:

providing a conductive element assembly between the cover and the testing socket to electrically connect the conductive surface of the cover to the testing socket;

forming a conductive layer on a lower surface of the printed circuit board, wherein the conductive layer is electrically connected to the ground layer of the printed circuit board; and providing a conductive fastener to secure the testing socket to the printed circuit board and electrically connect the testing socket to the conductive layer.

19. The method as claimed in claim 18, wherein the conductive element assembly further comprises a conductive member, a conductive element, and a first circuit element arranged outside the cover, wherein the conductive member is electrically connected to the conductive surface of the cover, the conductive element is electrically connected to the testing socket, and the first circuit element is disposed between and electrically connected to the conductive member and the conductive element, and wherein the first circuit element is an active or passive component, which is a diode or a resistor, or a connecting wire.

20. The method as claimed in claim 18, wherein the conductive layer comprises a conductive sheet and a conductive pad that is separated from the conductive sheet, wherein the conductive sheet is electrically connected to the conductive fastener, and the conductive pad is electrically connected to the ground layer of the printed circuit board, and the method further comprises:

providing a second circuit element over the lower surface of the printed circuit board to electrically connect the conductive sheet to the conductive pad, wherein the second circuit element is an active or passive component, which is a diode or a resistor, or a connecting wire.

* * * * *